(12) United States Patent
Pesavento et al.

(10) Patent No.: US 7,289,358 B2
(45) Date of Patent: Oct. 30, 2007

(54) MTP NVM ELEMENTS BY-PASSED FOR PROGRAMMING

(75) Inventors: Alberto Pesavento, Seattle, WA (US); Troy N. Gilliland, Newcastle, WA (US); Frederic J. Bernard, Fuveau (FR)

(73) Assignee: Impinj, Inc., Seattle, WA (US)

( * ) Notice: Subject to any disclaimer, the term of this patent is extended or adjusted under 35 U.S.C. 154(b) by 172 days.

(21) Appl. No.: 11/335,185

(22) Filed: Jan. 18, 2006

(65) Prior Publication Data

US 2006/0181927 A1 Aug. 17, 2006

Related U.S. Application Data

(63) Continuation-in-part of application No. 10/830,280, filed on Apr. 21, 2004, now Pat. No. 7,212,446, and a continuation-in-part of application No. 10/813,907, filed on Mar. 30, 2004, now Pat. No. 7,242,614, and a continuation-in-part of application No. 10/814,866, filed on Mar. 30, 2004, and a continuation-in-part of application No. 10/814,868, filed on Mar. 30, 2004, now Pat. No. 7,177,182.

(60) Provisional application No. 60/646,242, filed on Jan. 21, 2005.

(51) Int. Cl.
*G11C 11/34* (2006.01)

(52) U.S. Cl. ............. 365/180; 365/185.33; 365/184.14
(58) Field of Classification Search ................ 365/180, 365/185.33, 185.14, 185.21, 185.29, 185.18, 365/185.04
See application file for complete search history.

(56) References Cited

U.S. PATENT DOCUMENTS 6,954,383 B2 * 10/2005 Chiu et al. ............. 365/189.01
2006/0133175 A1 * 6/2006 Gutnik et al. ............ 365/225.7

* cited by examiner

*Primary Examiner*—Anh Phung
*Assistant Examiner*—Dang Nguyen
(74) *Attorney, Agent, or Firm*—Carl K. Turk; Merchant & Gould

(57) ABSTRACT

Non-Volatile Memory (NVM) cells include a selection circuit for providing an output based on selecting between an input data signal and an output of a Multiple Time Programmable (MTP) NVM element. The input data signal may be latched by a latch circuit such as a flip-flop first. The selector circuit's output is used to confirm the programming values for the MTP NVM element such that the element can be programmed correctly without losing time by reading the programmed MTP NVM element or reprogramming a misprogrammed element.

21 Claims, 10 Drawing Sheets

*DEVICE WITH OTP FUSE(S)*

DEVICE WITH MTP NVM

CELL WITH
BIT PROGRAM CONFIRM CIRCUIT

CELL ARRAY WITH
BIT PROGRAM CONFIRM CIRCUITS

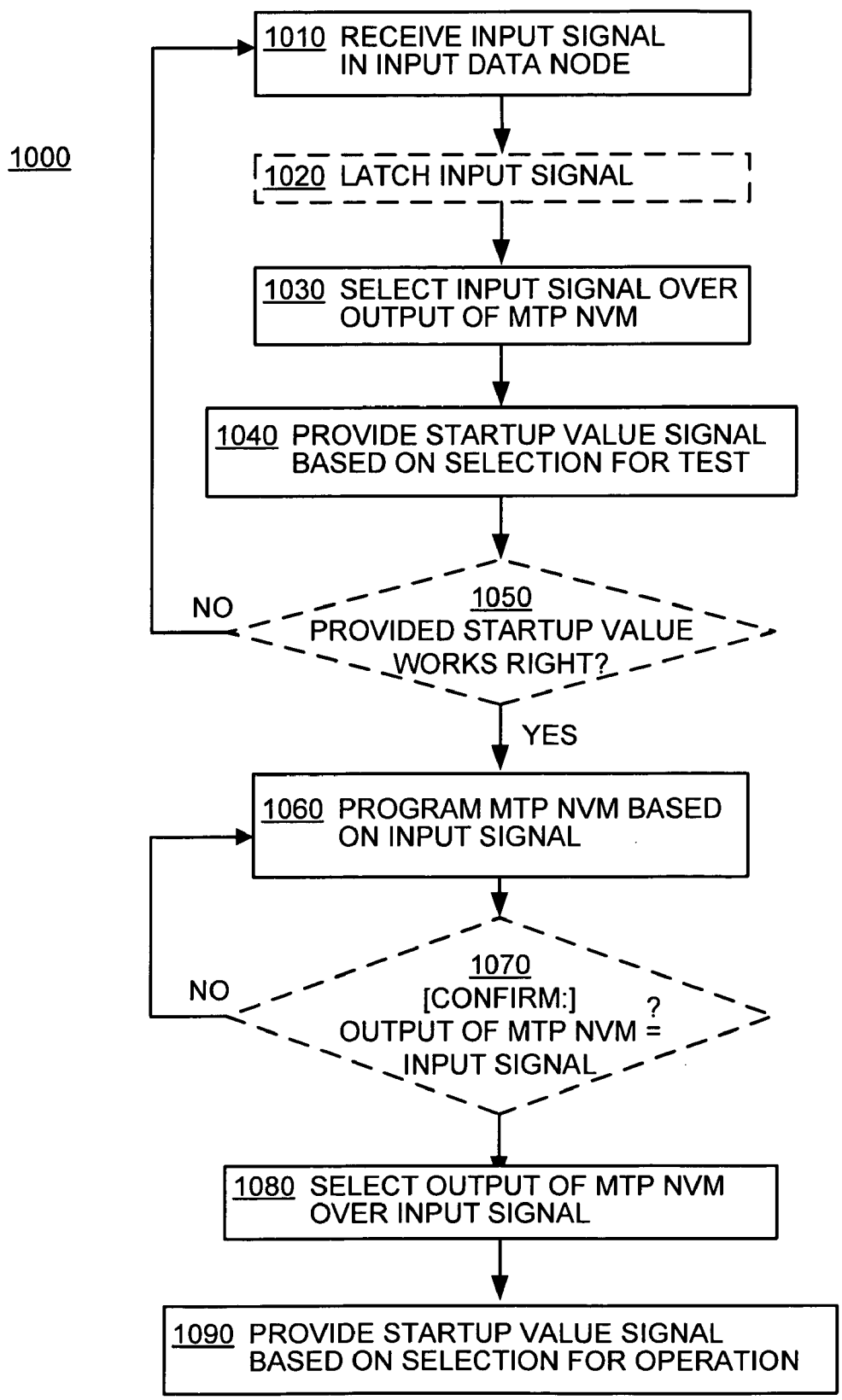
FIGURE 10     *METHODS*

# MTP NVM ELEMENTS BY-PASSED FOR PROGRAMMING

RELATED APPLICATIONS

This utility patent application is a continuation-in-part (CIP) of U.S. patent application Ser. No. 10/830,280 (IMPJ-0082) filed on Apr. 21, 2004 now U.S. Pat. No. 7,212,446, which is incorporated herein by reference. The benefit of the earlier filing date of the parent application is hereby claimed under 35 U.S.C. §120.

This utility patent application is a continuation-in-part (CIP) of U.S. patent application Ser. No. 10/813,907 (IMPJ-0027A) filed on Mar. 30, 2004 now U.S. Pat. No. 7,242,614, which is incorporated herein by reference. The benefit of the earlier filing date of the parent application is hereby claimed under 35 U.S.C. §120.

This utility patent application is a continuation-in-part (CIP) of U.S. patent application Ser. No. 10/814,866 (IMPJ-0027B) filed on Mar. 30, 2004, which is incorporated herein by reference. The benefit of the earlier filing date of the parent application is hereby claimed under 35 U.S.C. §120.

This utility patent application is a continuation-in-part (CIP) of U.S. patent application Ser. No. 10/814,868 (IMPJ-0027C) filed on Mar. 30, 2004 now U.S. Pat. No. 7,177,182, which is incorporated herein by reference. The benefit of the earlier filing date of the parent application is hereby claimed under 35 U.S.C. §120.

This application claims under 35 U.S.C. §119(e) the benefit of the filing date of U.S. Provisional Application Ser. No. 60/646,242 filed on Jan. 21, 2005, which is incorporated herein by reference.

TECHNICAL FIELD

The present invention relates to Non-Volatile Memory (NVM) circuits; and more particularly, to a Multiple Time Programmable (MTP) NVM element that can be by-passed for programming.

BACKGROUND

Memory devices are electronic devices arranged to store electrical signals. For example, a basic memory element may be a fuse that can either be open or be closed. Open and closed states of the fuse may be used to designate one bit of information corresponding to a value of 1 or 0. A plurality of memory elements can be combined in various arrangements in order to store multiple bits arranged in words or other combinations. Various electronic circuits including semiconductor devices such as transistors are used as memory elements.

Memory elements may be classified in two main categories: volatile and nonvolatile. Volatile memory loses any data as soon as the system is turned off. Thus, it requires constant power to remain viable. Most types of random access memory (RAM) fall into this category. Non-volatile memory does not lose its data when the system or device is turned off. An NVM device may be implemented as a MOS transistor, as a One Time Programmable (OTP) fuse, as a Multiple Time Programmable (MTP) fuse, and the like.

A range of considerations including a purpose of the device, power consumption, size, retention capacity and duration may influence design of non-volatile memory devices. In NVM devices comprising OTP fuses, the elements are programmed destructively (e.g flowing a high current through the fuse such that the fuse transitions into an open state). Programming time for such devices may be long in order to pass enough current to force the fusing/anti-fusing action. Thus, programming time becomes a major expense in device performance.

Furthermore, improper programming is irrecoverable. Therefore, the lack of ability to confirm programming of an NVM device prior to final programming may increase cost of manufacturing such devices and impede their performance.

SUMMARY

The invention provides NVM circuits that include an output selection capability such that a programming signal can be confirmed prior to an MTP NVM element being programmed.

In some embodiments, the NVM cell includes a selection circuit for providing an output based on selecting between the input data signal and an output of a MTP NVM element. The selector circuit's output is used to confirm the programming values for the MTP NVM element such that the element can be programmed correctly or reprogrammed.

In other embodiments, the input data signal may be latched by a latch circuit such as a flip-flop first. An output of the latch circuit may be used for confirmation first, and programming next if the confirmation is affirmative.

According to further embodiments, programming of the MTP NVM elements may be enabled by a program enable signal. The selector circuit(s) may select between the input data signal and the output of the MTP NVM element based on a select enable signal.

According to yet further embodiments, the NVM cells may be complemented by a confirmation circuit configured to perform the confirmation of the correct values for programming the MTP NVM elements.

It will be appreciated that by employing a selection between the input data signal and the output of the MTP NVM element, and performing a confirmation based on the selection, a processing time of the NVM cells will be improved during a calibration and/or start-up period.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Non-limiting and non-exhaustive embodiments are described with reference to the following drawings.

FIG. 10 is a logic flow diagram for methods according to embodiments.

DETAILED DESCRIPTION

Figure 1:
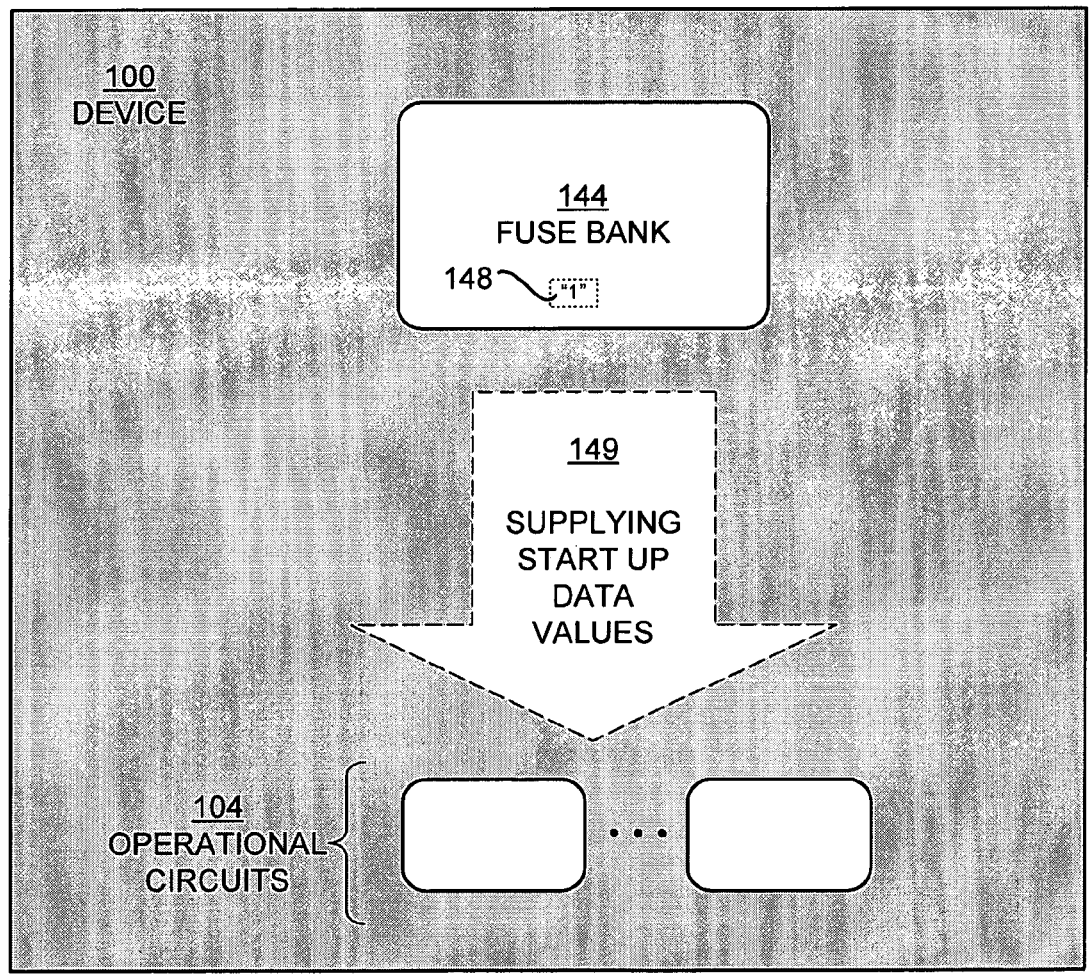
FIG. 1 is a block diagram of a device having One Time Programmable (OTP) fuses, for supplying data to other components of the device.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

Briefly, this disclosure is about providing a selection for an output of an NVM cell between an input data signal and an output of an MTP NVM element to be programmed. The selected outputs may be used to confirm a programming value for the MTP NVM element.

The invention is now described in more detail.

FIG. 1 is a block diagram of a device having One Time Programmable (OTP) fuses, for supplying data to other components of the device.

Many electronic devices include circuitry that may need an initial calibration, a power on reset (POR), a start up value for operation, and the like. For example, Radio Frequency IDentification (RFID) tags include oscillators that may receive a start up value for accurate and fast operation. Many other applications are known in the art.

One of the ways of providing a start up value to a circuit is storing data associated with the start up value in an NVM. As the device that includes the NVM is powered on, a portion of the NVM is read and the output provided to the circuit(s) that is to receive the start up value.

In the example device 100, fuse bank 144 is an exemplary implementation of an NVM circuit for storing start up values. Fuse bank 144 includes data value 148 that may be stored by one of the fuses. For example, an open state of the fuse may correspond to data value 148 having a digital value "1" or vice versa.

Fuse bank 144 may include One Time Programmable (OTP) fuses. Fuse bank 144 supplies start up values as indicated by reference numeral 149 to operational circuits 104.

Figure 2:
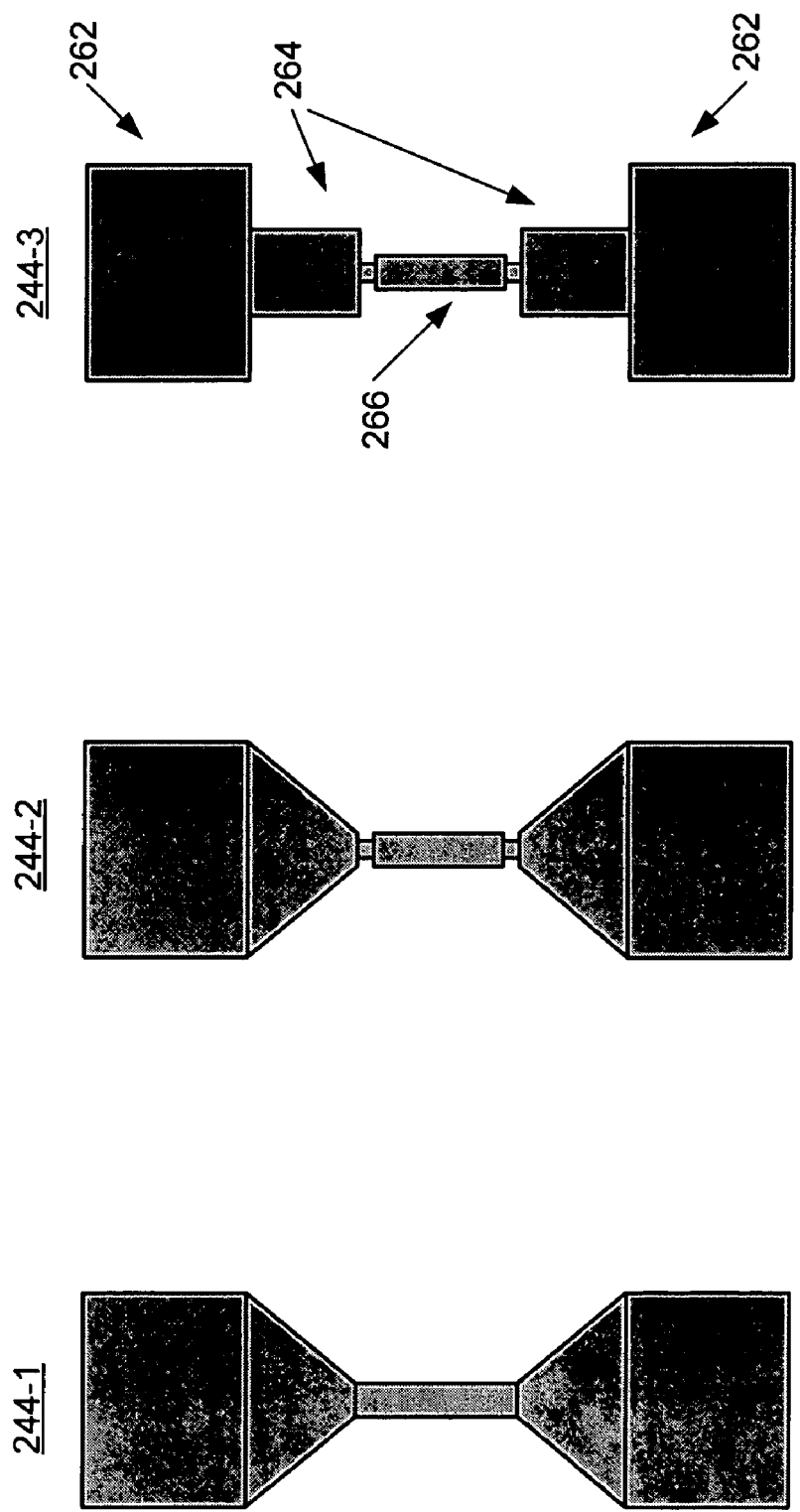
FIG. 2 illustrates example implementations of OTP fuses that may be used in the device of FIG. 1.

FIG. 2 illustrates example implementations of OTP fuses that may be used in the device of FIG. 1.

A fuse may be implemented in many ways including printed circuit board implementations, where a specially shaped layer of conductive material (e.g. metal) is etched on a layer of silicon insulator. Fuses 244-1, 244-2, and 244-3 are examples of printed circuit board fuses with different shapes.

A shape and dimensions of the fuse determine a sensitivity and an accuracy of the fuse because a thickness, a width, and a type of conductive material determine an amount of current that "blows" (opens) the fuse.

The portions of fuse 244-3 indicated by reference numeral 262 are typically used to provide contact to other circuits or conductive layers in a circuit board. Thus, a pair of vias may be implemented in areas 262 or adjacent to them.

The portions of fuse 244-3 indicated by reference numeral 264 are transition regions that determine along with the fuse element 266 an amount of current necessary to blow the fuse. As described above and shown in fuses 244-1 and 244-2, transition regions 264 may have varying shapes and dimensions.

Fuse element 266 is the portion of the fuse that is blown by the current exceeding a predetermined amount. A thickness and a width of the fuse element are the main components in determining the current limit. In some implementations, fuse element 266 may have a staggered shape for improved current accuracy.

Figure 3:
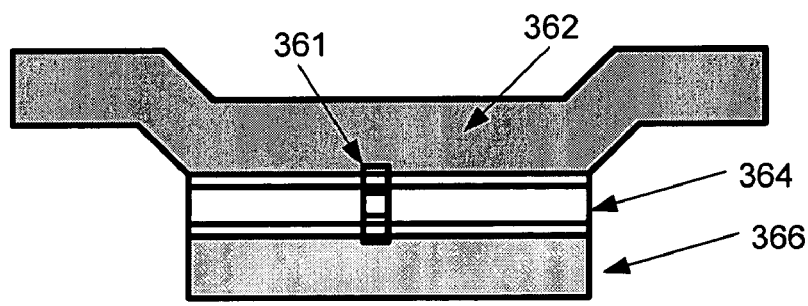
FIG. 3 illustrates example implementations of OTP anti-fuses that may be used in the device of FIG. 1.
Figure 3:
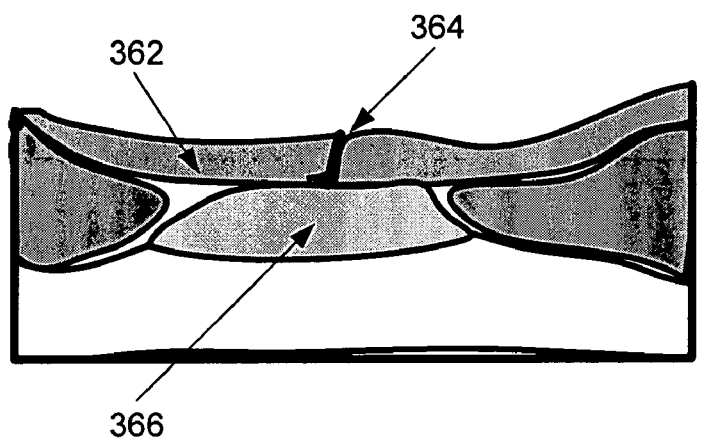
Figure 3:
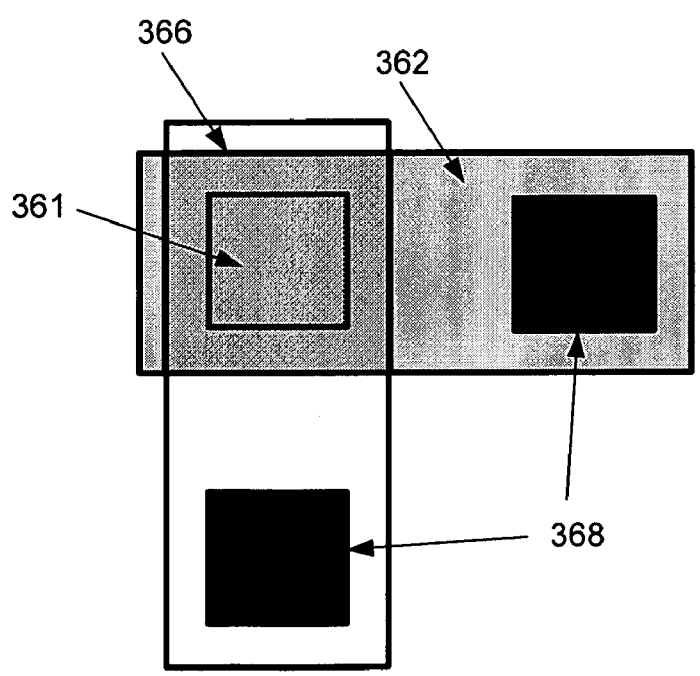

FIG. 3 illustrates example implementations of OTP antifuses that may be used in the device of FIG. 1.

An antifuse is an electrical device that performs the opposite function of a fuse. Whereas a fuse starts with a low resistance and is designed to permanently break an electrically conductive path (typically when the current through the path exceeds a specified limit) an antifuse starts with a high resistance is designed to permanently create an electrically conductive path (typically when the voltage across the antifuse exceeds a certain level).

Antifuses are widely used to permanently program Integrated Circuits (ICs). ICs that use antifuse technology employ a thin barrier of non-conducting amorphous silicon between two metal conductors. When a sufficiently high voltage is applied across the amorphous silicon it is turned into a polycrystalline silicon-metal alloy with a low resistance, which is conductive.

Furthermore, certain Programmable Logic Devices (PLDS) use antifuse technology to configure logic circuits and create a customized design from a standard IC design. Circuits built via the antifuse's permanent conductive paths may be faster than similar circuits implemented in PLDs using SRAM technology. Antifuses are sometimes referred to as via links because blown fuses create a connection between two crossing layers of wiring on the chip in the same way that a via on a printed circuit board creates a connection between copper layers.

The programming of antifuses may be performed after manufacturing, and is generally permanent and irreversible. With a poly-diffusion antifuse, the high current density creates heat, which melts a thin insulating layer between polysilicon and diffusion electrodes, creating a permanent resistive silicon link.

Example antifuse 344-1 includes Oxide-Nitrite-Oxide (ONO) dielectric layer 364 sandwiched between antifuse polysilicon 362 and n+ antifuse diffusion layer 366. Antifuse link 361 is positioned between the ton and bottom layers in ONO dielectric layer 364.

In a typical implementation, the ONO dielectric layer 364 may have a thickness of less than 10 nm, and the antifuse link may be about 20 nm wide.

Example antifuse 344-2 includes a split antifuse polysilicon layer 362 over n+antifuse diffusion layer 366. The portions of the antifuse polysilicon layer 362 are separated by a thin ONO dielectric layer 364, which is melted when the high current is applied connecting the two portions of the antifuse polysilicon layer 362 together.

Example anitfuse 344-3 includes n+ antifuse diffusion layer 366 partially superimposed over antifuse polysilicon layer 362. Each of these layers include contacts 368 in their non-overlapping portions.

Antifuse link 361 in the overlapping portion of the two layers is melted by the high current providing the connection and changing the fuse state to closed from open.

Figure 4:
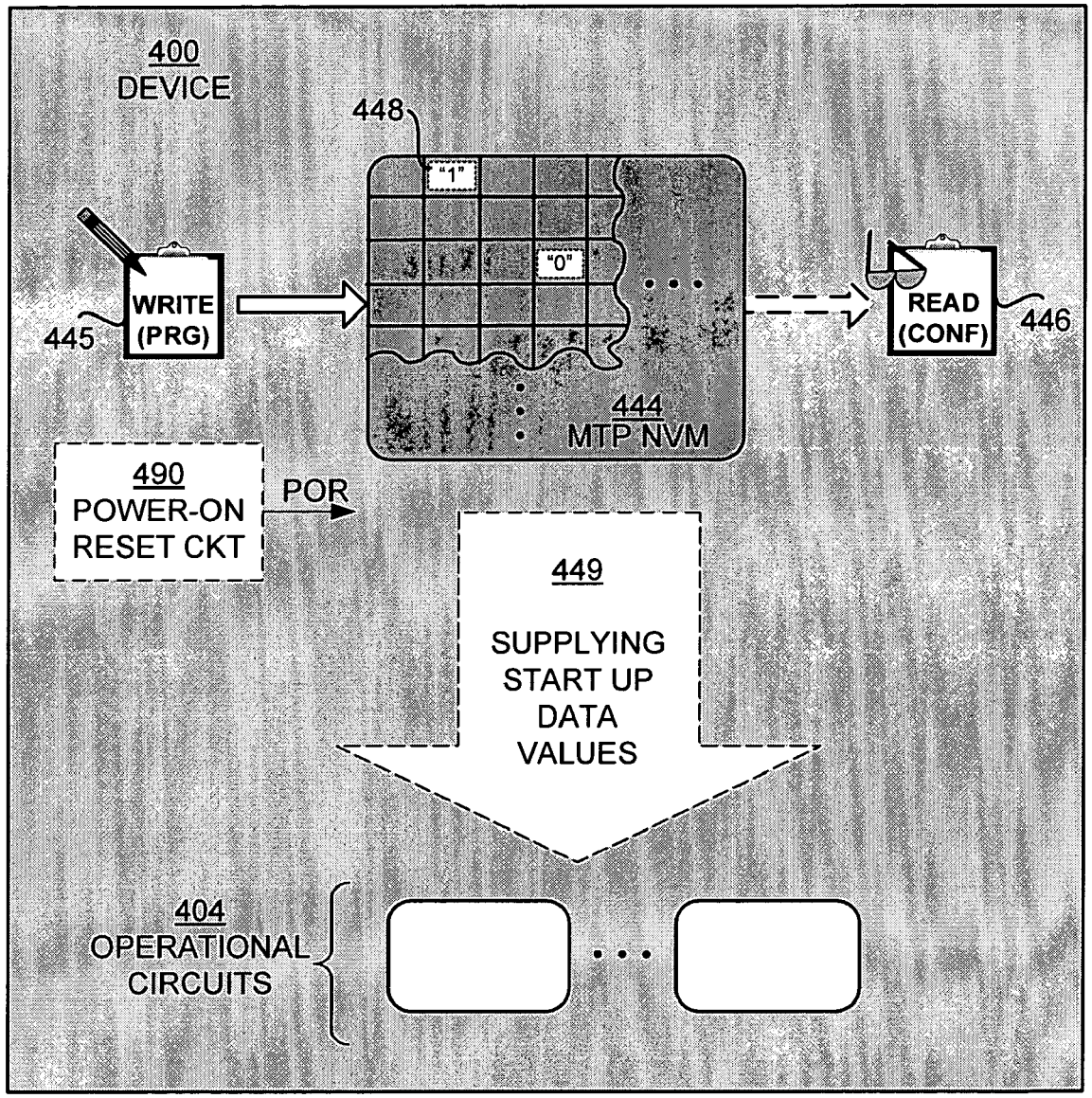
FIG. 4 is a conceptual block diagram of a device having a Multiple Time Programmable (MTP) Non-Volatile Memory (NVM) circuit for supplying data to other components of the device according to embodiments.

FIG. 4 is a conceptual block diagram of a device having a Multi Time Programmable (MTP) Non-Volatile Memory (NVM) circuit for supplying data to other components of the device according to embodiments.

Parts of device 400 that are similarly numbered in device 100 of FIG. 1, operate in a likewise manner as parts of device 100.

MTP NVM circuits are used for a variety of applications, ranging from code storage to setting start up values for operational circuits. Examples of start up values for operational circuits include, but are not limited to, MTP NVM elements that set a frequency of an oscillator, a voltage for a voltage-reference, a current for a bias generator, a polarity of an I/O Pad, an encryption key for a digital rights management application, and the like.

MTP NVM 444 is configured to store data in its elements (e.g. MTP NVM element 448) that can be provided to other circuits 404 as start up values. A write operation 445 performed on MTP NVM 444 is programming of one or more of its elements. An optional read operation 446 may also be performed on MTP NVM 444 for confirming the values to be programmed into the elements of MTP NVM 444.

In another embodiment, the optional read operation may be performed after the element(s) of MTP NVM has (have) been programmed to confirm the programmed value. If the confirmation yields an unacceptable result, the MTP NVM element(s) can be reprogrammed.

An optional Power-On Reset (POR) circuit 490 provides a POR signal that triggers the supplying of start up data values (449) to operational circuits 404.

By employing the optional read operation prior to programming MTP NVM 444, a confirmed value can be programmed to the selected elements of MTP NVM 444. Moreover, MTP NVM 444 can be programmed multiple times, based on a confirmation of the programmed values, thus, enabling correction of misprogrammed values.

MTP NVM 444 may be implemented in applications including, but not limited to, analog trimming circuits, product configuration storage, serial number storage, encryption key storage, and the like.

MTP NVM 444 may include, in addition to the fuse elements, circuitry for selecting a signal output (optional read operation), circuitry for latching the input signal, and the like. Details and examples of various embodiments using such circuitry are discussed below.

Figure 5:
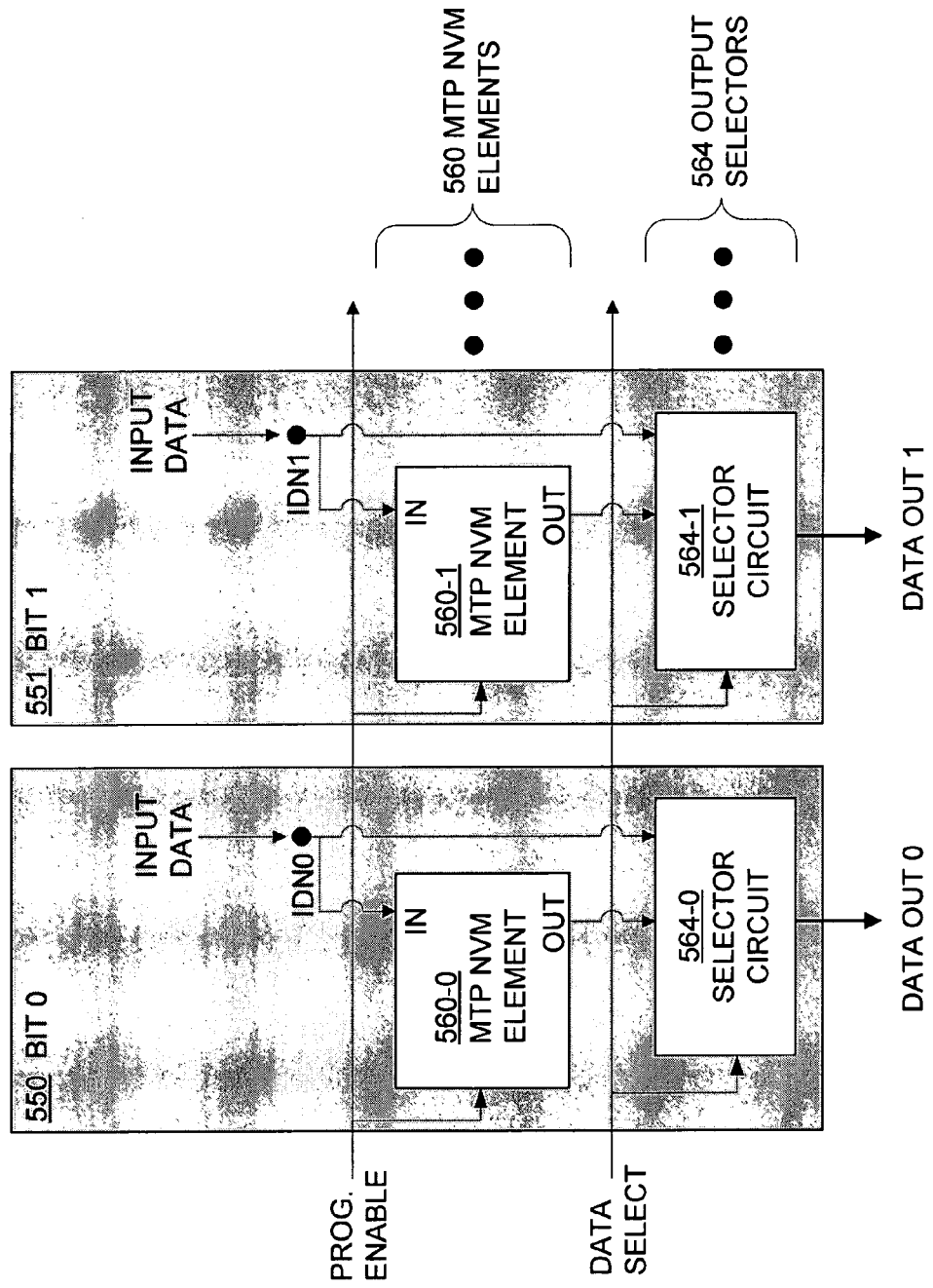
FIG. 5 is a block diagram of an array of cells of the MTP NVM circuit according to embodiments.

FIG. 5 is a block diagram of an array of cells of the MTP NVM circuit according to embodiments.

First group of circuits 550 store and provide bit 0 of the NVM array 544. Input data is provided at input data node IDN0 to MTP NVM element 560-0 and selector circuit 564-0. An output of MTP NVM element 560-0 is also provided to selector circuit 564-0.

Selector circuit 564-0 is configured to select between the input data signal and an output of the MTP NVM element 560-0 and provide data out 0, such that the input data signal can be confirmed prior to the programming of MTP NVM element 560-0. In one embodiment, an output of MTP NVM element 560-0 can be confirmed after programming such that the storage element can be reprogrammed if the output is not confirmed.

Second group of circuits 551 for bit 1 and subsequent groups are arranged to operate similar to the first group of circuits for bit 0 providing data out signals for each bit in the NVM array.

According to some embodiments, a program enable signal may be provided to the MTP NVM elements 560-X to initiate the programming of the elements.

Figure 6:
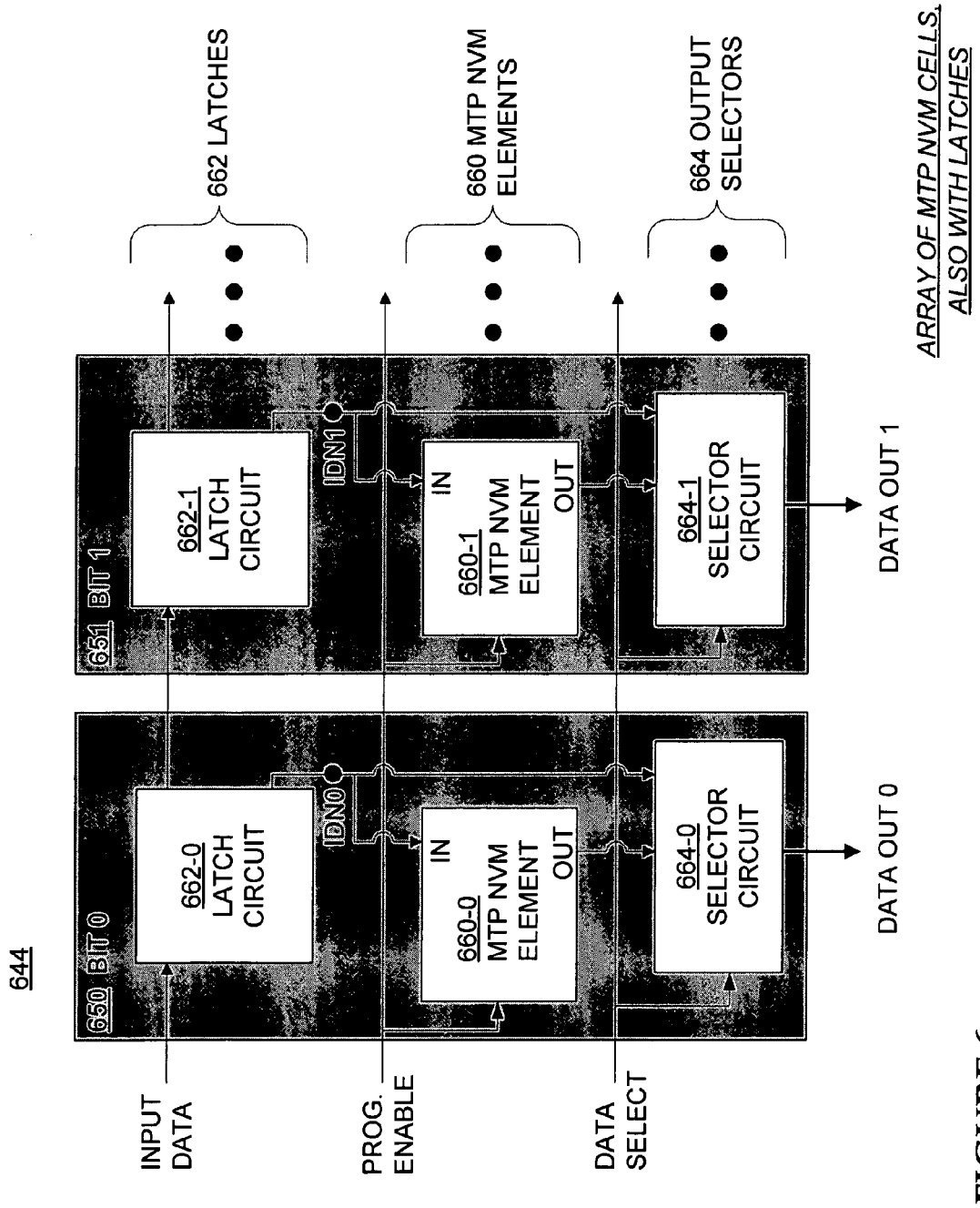
FIG. 6 is a block diagram of the array of FIG. 5, and further according to embodiments where a latch is provided.

According to other embodiments, a data select signal may be provided to the selector circuits enabling selection of input data signal or the output of the storage elements. FIG. 6 is a block diagram of the array of FIG. 5, and further according to embodiments where a latch is provided.

NVM array 644 includes groups of circuits (e.g. circuit group 650, 651, etc.) with MTP NVM elements (660-0, 660-1, etc.) and selector circuits (664-0, 664-1, etc.) that are arranged to operate in a similar manner to the circuits of NVM array 544 of FIG. 5.

Differently from NVM array 544, NVM array 644 includes latch circuits 662-0, 662-1, etc., in each group of circuits. The latch circuits are configured to receive and latch input data signal and provide the same signal at input data nodes IDN0, IDN1, etc. Accordingly, correct programming may be confirmed before the data storage elements are committed to the programming values.

Moreover, latch access times are typically faster than fuse programming times. Thus, test time for NVM array 644 and as a result cost of manufacturing (or operating) the NVM array is reduced.

Selector circuits 664 are arranged to select between an output of the latch circuits 662 and an output of the MTP NVM elements 660, and provide data out 1, data out 2, etc.

Figure 7:
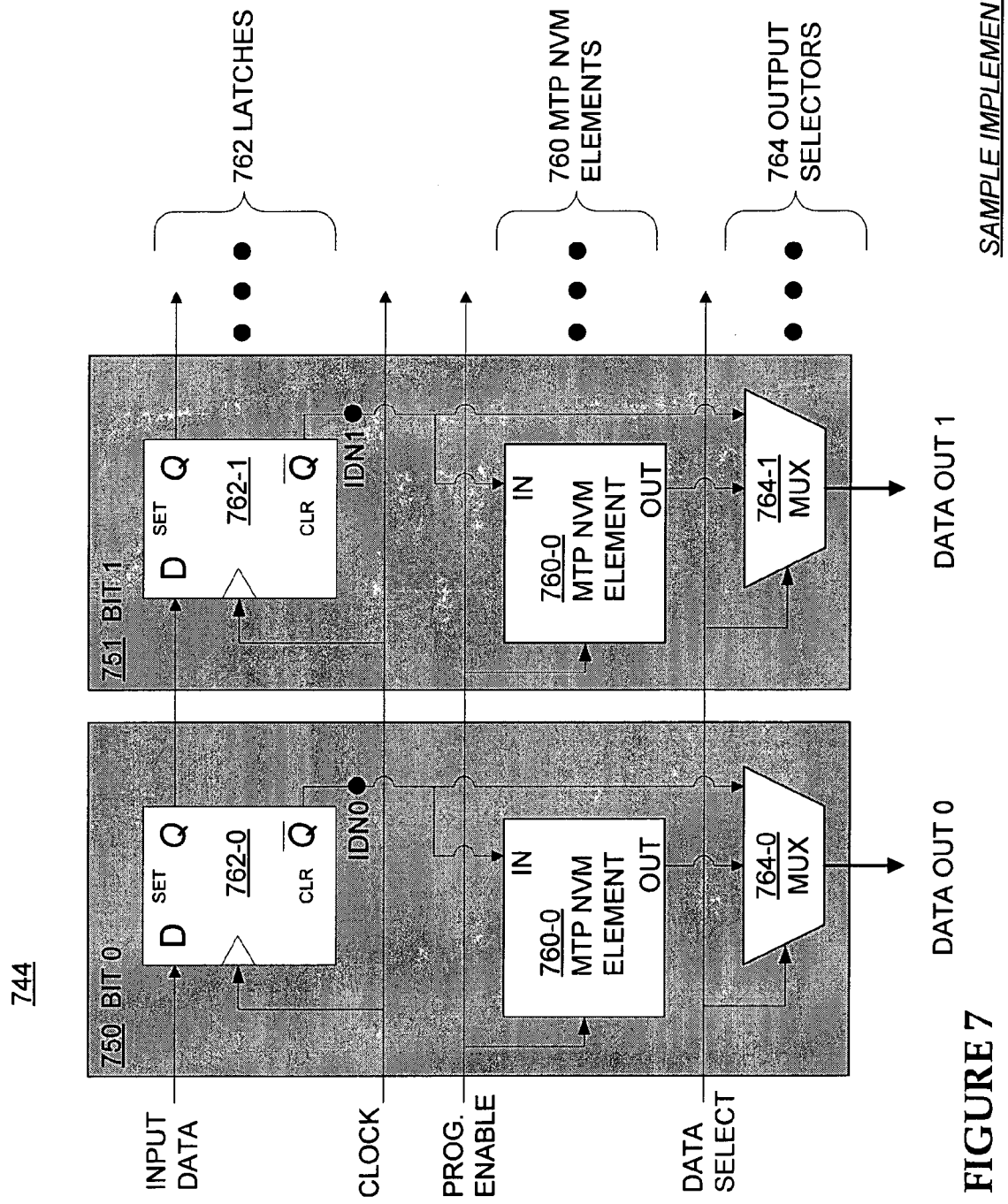
FIG. 7 is a block diagram of a sample implementation for the array of FIG. 6.

FIG. 7 is a block diagram of a sample implementation for the array of FIG. 6.

Latch circuits 762 in NVM array 744 are implemented as D type flip-flops 762-0, 762-1, etc. Input data signal is provided to a D input of first flip-flop circuit and then to the D input of the next flip-flop circuit from a Q output of the first flip-flop.

The input data signal, latched by the flip-flop circuits is provided from an inverted Q output of each flip-flop to the corresponding NTM NVM elements 760 and multiplexers 764 at nodes IDN0, IDN1, etc.

In addition to the program enable and data select signals, a clock signal is provided for timing the D type flip-flops of circuit groups 750, 752, etc.

While NVM array 744 is shown with D type flip-flops, other implementations such as an S-R type flip-flop, a J-K type flip-flop, or a toggle type flip-flop may also be employed without departing from a spirit and scope of the invention.

Figure 8:
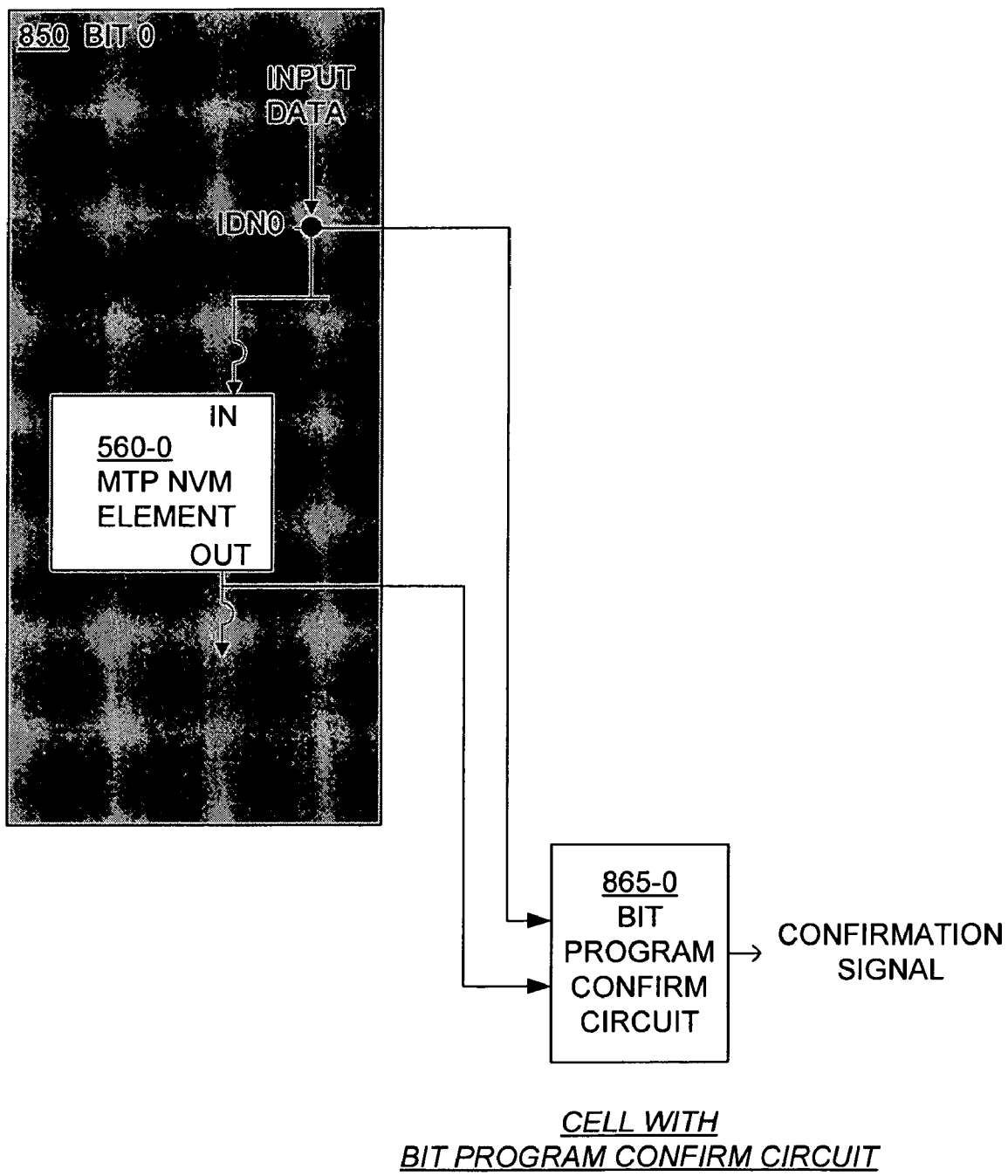
FIG. 8 is a block diagram of a sample embodiment of a cell that is further associated with a bit program confirm circuit.

FIG. 8 is a block diagram of a sample embodiment of a cell that is further associated with a bit program confirm circuit.

As described previously, a confirmation process may be employed to verify an output of the MTP NVM element 560-0 after it has been programmed or the input data signal prior to programming the MTP NVM element 560-0.

Bit program confirm circuit 865-0 may be implemented to compare input data signal from IDNO and the output of MTP NVM element 560-0, and to generate a confirmation signal.

The confirmation signal may then be used to enable programming of the MTP NVM element 560-0 based on the input data signal, storing bit 0 in cell 850.

Bit program confirm circuit 865-0 may be implemented in any way known in the art. For example, a digital comparator may be used to compare the input data signal and the output of MTP NVM element, and to generate the confirmation signal.

Figure 9:
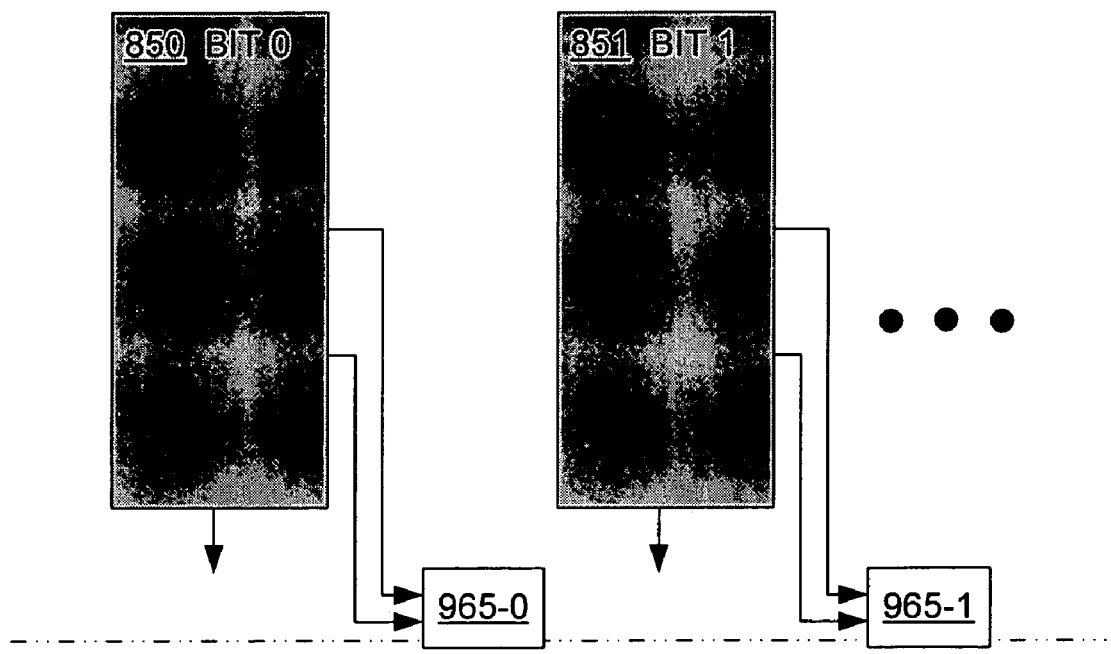
FIG. 9 is a block diagram of an array made with cells such as those of FIG. 8.

FIG. 9 is a block diagram of an array made with cells such as those of FIG. 8.

In an NVM array (e.g. array 944) comprising multiple cells (cell 850, cell 851, etc.), a confirmation process may be performed for each cell before committing the storage element of each cell to the programming value. A series of confirmation circuits (e.g. 965-0, 965-1, etc.) may be used for the confirmation process.

The confirmation circuits may be implemented discretely or as an integrated circuit. According to some embodiments, the confirmation may be performed by a single circuit or a group of circuits using time division multiplexing such that each cell of the NVM array is confirmed in a sequential manner.

FIG. 10 is a logic flow diagram for methods of using an MTP NVM element according to embodiments.

According to some embodiments, a memory circuit for use with an operational circuit includes an input data node configured to receive successively a plurality of input data signals and an MTP NVM element configured to be programmed a plurality of times, each time according to the signal present on the node at the time, and to further provide an output signal according to how it is programmed. The memory circuit further includes a selector circuit configured to provide a start up value signal to the operational circuit by selecting one of the latest signal present on the node, and the output signal of the MTP NVM element. The selector circuit may be a multiplexer.

The memory circuit may also include a latch configured to receive the input data signals and present them on the node. The latch may be a D type flip-flop, an S-R type flip-flop, a J-K type flip-flop, or a toggle type flip-flop.

The MTP NVM element may be programmable responsive to a programming enable signal. In addition, the selector circuit may be configured to perform the selection responsive to a data select signal.

According to another embodiment, the memory circuit may be a Power On Reset (POR) circuit adapted to generate a POR signal after being powered down and powered up again, and the start up value signal may be provided responsive to the POR signal.

According to further embodiment, the memory circuit may include a bit program confirm circuit adapted to output a confirmation signal indicative of whether the output signal of the programmed MTP NVM element is in accordance with the signal present on the node. The bit program confirm circuit may be a logical circuit such as an XNOR gate.

According to other embodiments, a memory array for use with an operational circuit may include a plurality of input data nodes and a plurality of Multiple Time Programmable (MTP) Non-Volatile Memory (NVM) elements, each corresponding respectively to one of the nodes, each configured to be programmed a plurality of times, each time according to a signal present on its corresponding node, and to further provide an output signal according to how it is programmed. The memory array may further include a plurality of selector circuits each corresponding respectively to one of the nodes and its corresponding MTP NVM element, each configured to provide a start up value signal to the operational circuit by selecting one of a signal present on its corresponding node, and the output signal of its corresponding MTP NVM element.

The memory array may also include a plurality of latches each corresponding respectively to one of the nodes, each latch configured to receive successively a plurality of input data signals and present them on its corresponding node.

At least one of the latches includes one of a D type flip-flop, an S-R type flip-flop, a J-K type flip-flop, and a toggle type flip-flop. A first one of the latches may be arranged serially with a second one of the latches, and the second latch may be adapted to latch an input data signal latched in the first latch.

According to one embodiment, the memory array may also include a plurality of a bit program confirm circuits, each adapted to output a confirmation signal indicative of whether the output signal of its corresponding programmed MTP NVM element is in accordance with a signal present on its corresponding node. The bit program confirm circuits may be logical circuits such as XNOR gates.

According to another embodiment, a first one of the bit program confirm circuits may be adapted to receive the confirmation signal of a second one of the bit program confirm circuits. The memory array may also include a daisy chaining circuitry such that the confirmation signal of the first bit program confirm circuit also indicates that the confirmation signal of the second bit program confirm circuit indicates that the output signal of the programmed MTP NVM element corresponding to the second confirm circuit is in accordance with the latest signal latched in the latch corresponding to the second confirm circuit.

Now referring to FIG. 10, an input signal is received at an input data node. The input signal may be intended for programming one or more of the NVM elements. The signal may be received internally from a subcircuit or from an external source.

According to next optional operation 1020, the input signal is latched. In some embodiments, the input signal may be provided to the NVM element(s) directly skipping the latching step.

According to next operation 1030, the input signal is selected over an output of the MTP NVM element(s). The selection may be made by a multiplexer or similar circuit.

According to next operation 1040, a start up value signal is provided for testing based on the selection. The MTP NVM device may be used in an application, such as an RFID tag, to provide start up (or calibration) values for different circuits upon power-on.

At next optional decision operation 1050, a determination is made whether the provided start up value is acceptable. The start up value may be confirmed in many ways including, but not limited to, during a calibration mode of the circuitry, by a confirmation circuit, and the like. If the provided start up value is not acceptable, processing returns to operation 1010 for receiving another input signal. Otherwise, processing advances to operation 1060.

According to operation 1060, the MTP NVM element(s) is (are) programmed based on the input signal.

According to next optional decision operation 1070, a determination is made whether an output of the programmed MTP NVM element(s) is substantially equal to the input signal.

According to other embodiments, the MTP NVM may be programmed based on the input signal to values that are not necessarily the same as the input signal. In such embodiments, the output of the MTP NVM element(s) may be confirmed by verifying whether the output of the MTP NVM is substantially equal to an expected value.

If the output of the MTP NVM is not confirmed at operation 1070, processing returns to operation 1060 for reprogramming of the MTP NVM. Otherwise, processing advances to operation 1080.

According to next operation 1080, the output of the MTP NVM is selected over the input signal by the selection circuit.

According to next operation 1090, a start up value signal is provided for operation based on the selection at operation 1080.

In the above, the order of operations is not constrained to what is shown, and different orders may be possible. In addition, actions within each operation can be modified, deleted, or new ones added without departing from the scope and spirit of the invention. Plus other, optional operations and actions can be implemented with these methods, as will be inferred from the earlier description.

In this description, numerous details have been set forth in order to provide a thorough understanding. In other instances, well-known features have not been described in detail in order to not obscure unnecessarily the description.

A person skilled in the art will be able to practice the present invention in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A memory circuit for use with an operational circuit, comprising:
   an input data node configured to receive successively a plurality of input data signals;
   a Multiple Time Programmable (MTP) Non-Volatile Memory (NVM) element configured to be programmed a plurality of times, each time according to the signal present on the node at the time, and to further provide an output signal according to how it is programmed; and
   a selector circuit configured to provide a start up value signal to the operational circuit by selecting one of the latest signal present on the node, and the output signal of the MTP NVM element.

2. The circuit of claim 1, further comprising:
   a latch configured to receive the input data signals and present them on the node.

3. The circuit of claim 2, wherein
   the latch includes one of a D type flip-flop, an S-R type flip-flop, a J-K type flip-flop, and a toggle type flip-flop.

4. The circuit of claim 1, wherein
   the selector circuit is a multiplexer.

5. The circuit of claim 1, wherein
   the MTP NVM element is configured to be programmed responsive to a programming enable signal.

6. The circuit of claim 1, wherein
   the selector circuit is configured to perform the selection responsive to a data select signal.

7. The circuit of claim 1, wherein
   a Power On Reset (POR) circuit is adapted to generate a POR signal after being powered down and powered up again, and
   the start up value signal is provided responsive to the POR signal.

8. The circuit of claim 1, further comprising:
   a bit program confirm circuit adapted to output a confirmation signal indicative of whether the output signal of the programmed MTP NVM element is in accordance with the signal present on the node.

9. The circuit of claim 8, wherein
   the bit program confirm circuit is a logical circuit.

10. The circuit of claim 8, wherein
    the bit program confirm circuit is an XNOR gate.

11. A memory array for use with an operational circuit, comprising:
    a plurality of input data nodes;
    a plurality of Multiple Time Programmable (MTP) Non-Volatile Memory (NVM) elements, each corresponding respectively to one of the nodes, each configured to be programmed a plurality of times, each time according to a signal present on its corresponding node, and to further provide an output signal according to how it is programmed; and
    a plurality of selector circuits each corresponding respectively to one of the nodes and its corresponding MTP NVM element, each configured to provide a start up value signal to the operational circuit by selecting one of a signal present on its corresponding node, and the output signal of its corresponding MTP NVM element.

12. The array of claim 11, further comprising:
    a plurality of latches each corresponding respectively to one of the nodes, each latch configured to receive successively a plurality of input data signals and present them on its corresponding node.

13. The circuit of claim 12, wherein
    one of the latches includes one of a D type flip-flop, an S-R type flip-flop, a J-K type flip-flop, and a toggle type flip-flop.

14. The array of claim 11, wherein
    a first one of the latches is arranged serially with a second one of the latches, and
    the second latch is adapted to latch an input data signal latched in the first latch.

15. The array of claim 11, wherein
    the MTP NVM elements are configured to be programmed responsive to a programming enable signal.

16. The array of claim 11, wherein
    the selector circuits are configured to perform the selection responsive to a data select signal.

17. The array of claim 11, wherein
    a Power On Reset (POR) circuit is adapted to generate a POR signal after being powered down and powered up again, and
    the start up value signals are provided responsive to the POR signal.

18. The array of claim 11, further comprising:
    a plurality of bit program confirm circuits, each adapted to output a confirmation signal indicative of whether the output signal of its corresponding programmed MTP NVM element is in accordance with a signal present on its corresponding node.

19. The array of claim 18, wherein the bit program confirm circuits are logical circuits.

20. The array of claim 18, wherein the bit program confirm circuits are XNOR gates.

21. The array of claim 18, wherein a first one of the bit program confirm circuits is adapted to receive the confirmation signal of a second one of the bit program confirm circuits; and further comprising daisy chaining circuitry such that the confirmation signal of the first bit program confirm circuit also indicates that the confirmation signal of the second bit program confirm circuit indicates that the output signal of the programmed MTP NVM element corresponding to the second confirm circuit is in accordance with the latest signal latched in the latch corresponding to the second confirm circuit.

* * * * *

UNITED STATES PATENT AND TRADEMARK OFFICE
CERTIFICATE OF CORRECTION

| | | |
|---|---|---|
| PATENT NO. | : 7,289,358 B2 | Page 1 of 1 |
| APPLICATION NO. | : 11/335185 | |
| DATED | : October 30, 2007 | |
| INVENTOR(S) | : Pesavento et al. | |

It is certified that error appears in the above-identified patent and that said Letters Patent is hereby corrected as shown below:

In column 4, line 51, delete "(PLDS)" and insert -- (PLDs) --, therefor.

In column 4, line 53, delete "antifuse's" and insert -- antifuses --, therefor.

In column 5, line 8, delete "n+antifuse" and insert -- n+ antifuse --, therefor.

In column 5, line 13, delete "anitfuse" and insert -- antifuse --, therefor.

In column 6, lines 23-25, after "storage elements." delete "FIG. 6 is a block diagram......latch is provided." and insert the same on line 24 as a new paragraph.

Signed and Sealed this

First Day of April, 2008

JON W. DUDAS
*Director of the United States Patent and Trademark Office*